(12) United States Patent
Majidzadeh Bafar et al.

(10) Patent No.: US 10,931,243 B2
(45) Date of Patent: Feb. 23, 2021

(54) SIGNAL COUPLING METHOD AND APPARATUS

(71) Applicant: Apple Inc., Cupertino, CA (US)

(72) Inventors: Vahid Majidzadeh Bafar, Campbell, CA (US); Mansour Keramat, Los Gatos, CA (US); Tao Wang, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 29 days.

(21) Appl. No.: 16/281,927

(22) Filed: Feb. 21, 2019

(65) Prior Publication Data
US 2020/0274501 A1 Aug. 27, 2020

(51) Int. Cl.
*H03F 1/02* (2006.01)
*H03F 3/00* (2006.01)
*H03K 5/24* (2006.01)
*H03K 5/003* (2006.01)
*H03F 3/04* (2006.01)

(52) U.S. Cl.
CPC ............ *H03F 3/005* (2013.01); *H03F 3/04* (2013.01); *H03K 5/003* (2013.01); *H03K 5/249* (2013.01)

(58) Field of Classification Search
CPC .............................. H03F 3/005; H03K 5/003
USPC ................................................ 330/9; 326/62
See application file for complete search history.

(56) References Cited

U.S. PATENT DOCUMENTS

| | | |
|---|---|---|
| 6,940,348 B2 * | 9/2005 | Confalonieri ........... H03F 1/303 330/69 |
| 7,948,270 B1 | 5/2011 | Evans et al. |
| 9,397,645 B2 | 7/2016 | Bernacchia et al. |
| 9,762,257 B2 | 9/2017 | Zanbaghi et al. |

* cited by examiner

*Primary Examiner* — Steven J Mottola
(74) *Attorney, Agent, or Firm* — Kowert, Hood, Munyon, Rankin & Goetzel, P.C.; Erik A. Heter

(57) ABSTRACT

A signal coupling method and apparatus is disclosed. A coupling network is coupled to convey signals from first functional circuit block to a second functional circuit block. The coupling network includes a first signal path having a first capacitor for providing AC coupling between the first and second functional circuit blocks. The coupling network further includes a second signal path in parallel with the first signal path. The second signal path includes a switched capacitor circuit coupled to receive a first common mode voltage corresponding to the first functional circuit block and a second common mode voltage corresponding to the second functional circuit block.

20 Claims, 5 Drawing Sheets

US 10,931,243 B2

SIGNAL COUPLING METHOD AND APPARATUS

BACKGROUND

Technical Field

This disclosure is directed to electronic circuits, and more particularly, to circuit networks used to convey signals.

Description of the Related Art

Many electronic systems include a number of different functional circuit blocks coupled to one another. Different types of systems may have different requirements for coupling functional circuit blocks together. For example, the various circuits in a radio receiver may have different requirements for coupling to one another than functional circuit blocks in digital processors.

DC (direct current) and AC (alternating current) coupling methods are commonly used in many systems. DC coupling is useful in systems in which information is conveyed in low frequency bands between circuit blocks of the system. Such information may include a DC offset voltage.

AC coupling may provide isolation at DC and low frequencies between circuits. Additionally, AC coupling may provide a significant amount of flexibility, including common mode decoupling flexibility.

SUMMARY

A signal coupling method and apparatus is disclosed. In one embodiment, a coupling network is coupled to convey signals from a first functional circuit block to a second functional circuit block. The coupling network includes a first signal path having a first capacitor for providing AC coupling between the first and second functional circuit blocks. The coupling network further includes a second signal path in parallel with the first signal path. The second signal path includes a switched capacitor circuit coupled to receive a first common mode voltage corresponding to the first functional circuit block and a second common mode voltage corresponding to the second functional circuit block.

In various embodiments, the coupling network effectively provides DC coupling between the first and second functional circuit blocks, via the switched capacitor circuit. Accordingly, the coupling network provides both AC and DC coupling. The DC coupling portion, through the switched capacitor circuit, enables low frequency information to be conveyed from the first functional circuit block to the second that might otherwise be lost if only AC coupling was provided. Similarly, the AC coupling path may provide common mode decoupling flexibility that is unavailable when only DC coupling is used.

BRIEF DESCRIPTION OF THE DRAWINGS

The following detailed description makes reference to the accompanying drawings, which are now briefly described.

Figure 1:
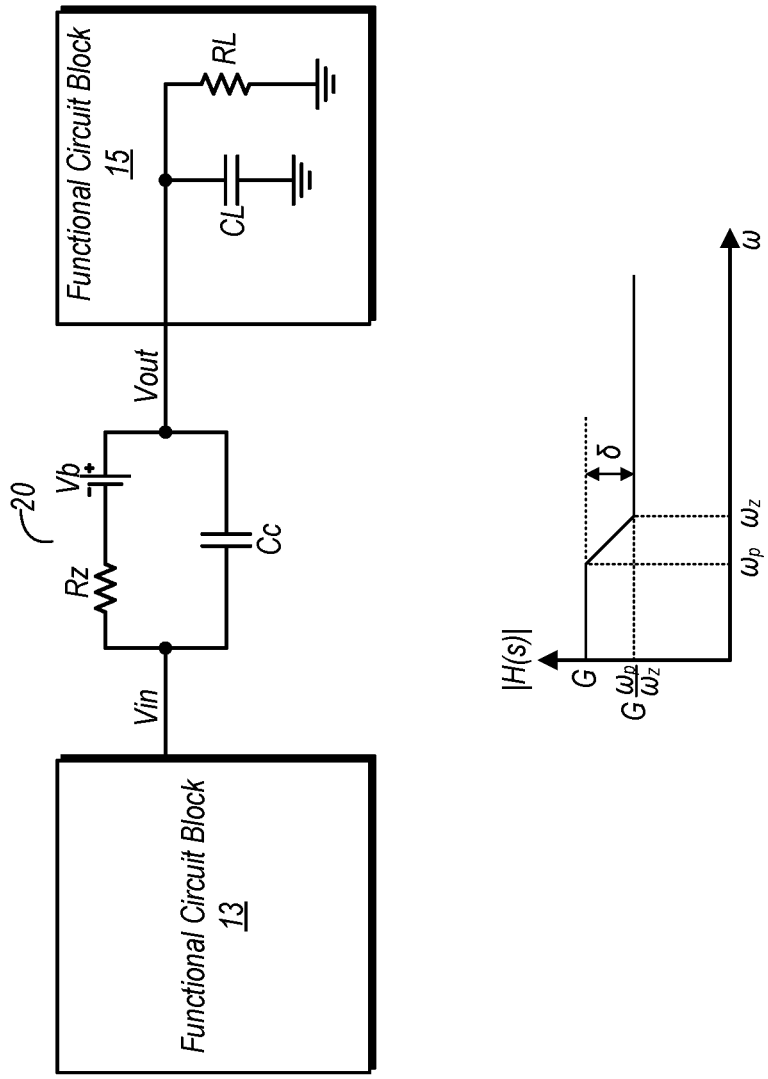
FIG. 1 is a schematic diagram of one embodiment of a coupling network.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. s phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to a method and apparatus for coupling functional circuit blocks to one another. In particular, the disclosure provides a network that combines AC (alternating current) and DC (direct current) coupling methods. When AC coupling is used exclusively, low frequency and DC portions of a signal are blocked, and thus at least some information may be prevented from being conveyed through the AC coupling network. When DC coupling is used exclusively, the respective DC operating points between the coupled circuits are not isolated from and are thus dependent upon) one another. The various method and apparatus embodiments disclosed herein overcome these issues by combining DC and AC coupling into a single coupling network.

In one embodiment, a coupling network coupled between first and second functional circuit blocks includes first and second signal paths. The first signal path provides AC coupling between the functional circuit blocks. The second signal path, which is in parallel with the first, includes a switched capacitor circuit and effectively provides DC coupling between the two functional circuit blocks without making the DC operating points dependent upon one another. The switched capacitor network is coupled to receive a first common mode voltage associated the first functional circuit block (from which the signal is originating) and a second common mode voltage associated with the second functional circuit block (to which the signal is being conveyed. Additional details of various embodiments of a coupling network, in accordance with this disclosure, are discussed below.

FIG. 1 is a schematic diagram of one embodiment of a coupling network. In the embodiment shown, coupling network 20, coupled between functional circuit blocks 13 and 15, is shown from a circuit analysis point of view (note capacitor CL and resistor RL represent load capacitance and resistance, respectively). Coupling network 20 includes first and second signal paths, in parallel with one another, between the Vin and Vout node. A first signal path, that includes capacitor Cc, provides AC coupling between functional circuit blocks 13 and 15. The second signal path, including resistor Rz and battery voltage Vb, effectively provides DC coupling between the two functional circuit blocks 13 and 15. Implementation of the battery voltage is discussed in more detail with respect to FIG. 2. It is further noted that the voltage Vb represents a difference in the common mode voltages between the first and second functional circuit blocks. The resistance value Rz in the embodiment shown may be significantly less than that of the load resistance, RL.

The transfer function H(s) of the embodiment of coupling network 20 shown in FIG. 1 is as follows:

$$H(s) = G \times \frac{1 + \frac{s}{\omega_z}}{1 + \frac{s}{\omega_p}} \quad (1)$$

where $\omega_z = \frac{1}{R_Z C_C}$, $\omega_p = \frac{R_L + R_Z}{R_Z R_L (C_L + C_C)}$, and $G = \frac{1}{1 + R_Z/R_L}$ The frequency response of coupling network 20 is shown graphically toward the bottom of FIG. 1, wherein:

$$\delta = G\left(1 - \frac{\omega_p}{\omega_z}\right). \quad (2)$$

In practice, the pole and zero frequencies $\omega_p$ and $\omega_z$ are very close, while the circuit can be designed such that the value of δ can be very small (e.g., 0.2 dB). Accordingly, coupling network 20 may provide a relatively flat gain response down to very low frequencies and even DC (0 Hz).

Figure 2:
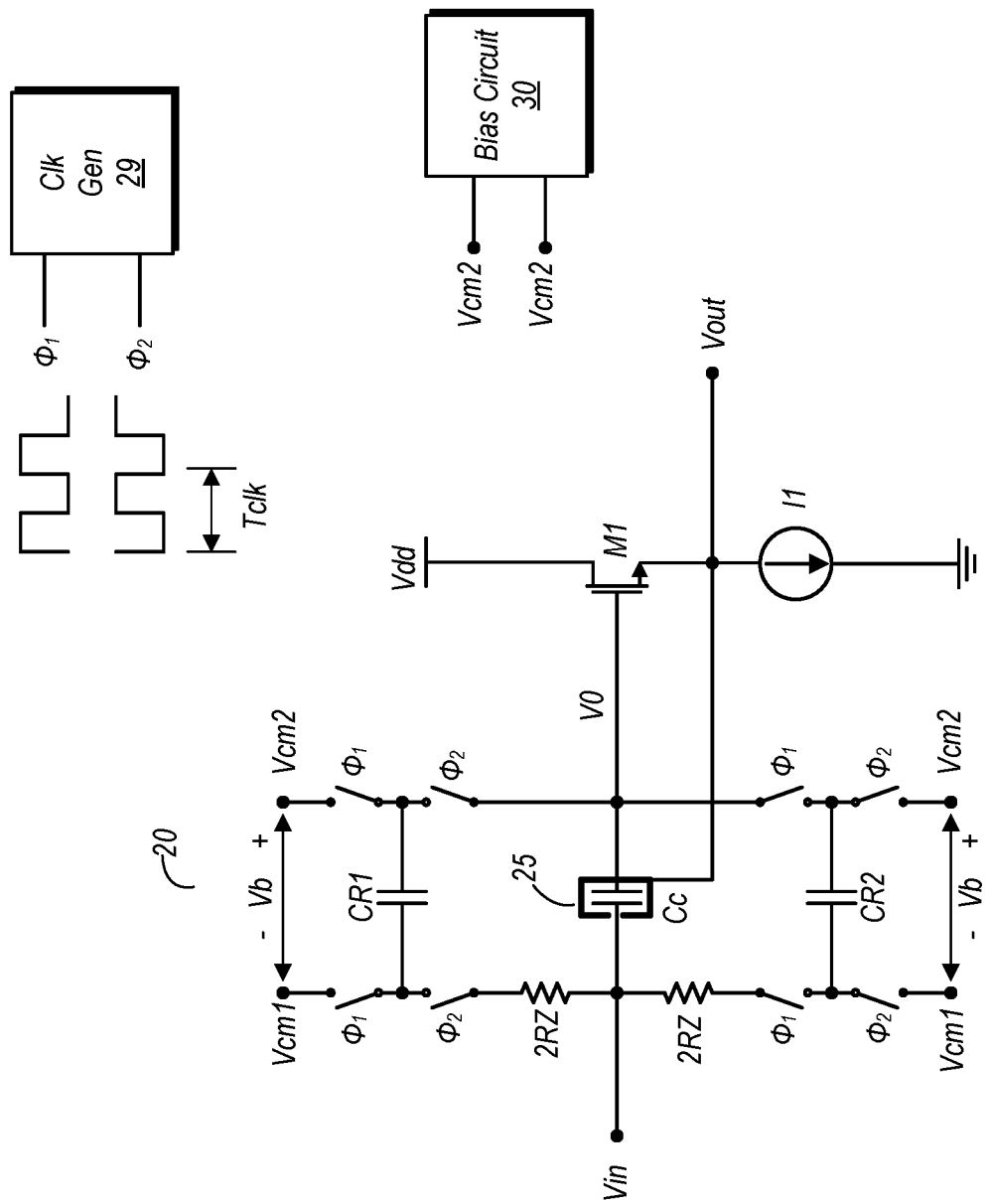
FIG. 2 is a schematic diagram of one embodiment of a coupling network coupled between two functional circuit blocks.

FIG. 2 is a schematic diagram of one embodiment of a coupling network coupled between two functional circuit blocks. A first, AC coupled signal path is provided through capacitor Cc. The second signal path, which implements the battery voltage Vb and effectively provides DC coupling, is implemented here using a switched capacitor circuit. The switched capacitor circuitry in this embodiment includes two sub-paths, a first through capacitor CR1 and a second through capacitor CR2. The resistor Rz shown in FIG. 1 is implemented here as two resistances, 2RZ, one in each of the complementary portions of the switched capacitor circuitry. The battery voltage Vb here is equivalent to the difference between the common mode voltages, Vcm1 and Vcm2. These common mode voltages are associated with their respective functional circuit blocks, with Vcm1 being associated with the circuit from which the signal originates, and Vcm2 associated with the circuit receiving the signal. The second common mode voltage, Vcm2, is provided by a bias circuit 30, which is discussed below in reference to FIG. 3.

It is noted that embodiments are possible and contemplated in which the switched capacitor circuitry is implemented in a different manner (e.g., with only one instance of CR) are possible and contemplated.

Coupling network 20 further includes a transistor M1, having a gate terminal coupled to node V0. Transistor M1 includes a gate terminal coupled to a junction of the first and second signals paths (at V0) and a source terminal coupled to provide an output signal, Vout, from coupling network 20 to a second functional circuit block to which coupling network 20 is coupled. A shield 25 effectively surrounds capacitor Cc, with the shield being electrically coupled to the source terminal of M1 (the drain terminal of which is coupled to a supply voltage node, Vdd). A current source I1 is also coupled between the source terminal of M1 and ground. The source terminal of M1 is further coupled to provide the output signal of coupling network 20 on the node Vout. Coupling network 20 is also coupled to a clock generation circuit 29 and a bias circuit 30.

The switched capacitor circuitry of coupling network 20 as shown here includes two sets of switches. A first set of these switches are closed responsive to an active phase (e.g., high) of clock signal $\phi_1$, while switches of a second set are closed responsive to an active phase of clock signal $\phi_2$. These clock signals are generated by clock generation circuit 29, which may be any type of circuitry suitable for generating clock signals. Each of these clock signals may hold an associated switch closed for one half of a time Tclk. It is further noted, as shown in the drawing, that clock signals $\phi_1$ and $\phi_2$ are of opposite phase with respect to each other, with $\phi_1$ being active while $\phi_2$ is inactive, and vice versa.

In the embodiment shown, capacitor CR1 is charged to the battery voltage Vb (Vcm2−Vcm1) when clock signal $\phi_1$ is active, and the correspondingly labeled switches are closed. Meanwhile, when clock signal $\phi_1$ is active, capacitor CR2 is in parallel with capacitor Cc, and thus discharges in the correspondingly coupled signal path between Vin and V0. When clock signal $\phi_2$ is active, CR2 charges to the difference between Vcm1 and Vcm2, while CR1, now in parallel with Cc, discharges in the correspondingly coupled signal path between Vin and V0. Accordingly, at any given time, one of capacitors CR1 and CR2 is charging to Vb, while the other one of these capacitors is discharging between Vin and V0. Through this operation, DC voltages and low frequency signals are transmitted through the switched capacitor circuitry from Vin to Vo.

The use of two sub-paths through the switched capacitor circuitry may reduce, if not eliminate, submodulation problems that could otherwise occur if only a single signal path was provided. When only a single path is provided, the input signal may be modulated by harmonics of the frequency of the clock signals used to open and close the switches. Accordingly, the switched capacitor circuitry is arranged to provide complementary operation in which CR1 and CR2 are charged and discharged in non-overlapping clock phases, which may resolve the intermodulation problem.

In the embodiment shown, capacitor Cc is substantially surrounded by a shield 25. Shield 25 is further coupled, electrically, to the source terminal of transistor M1. In steady state operation, the stored voltage across capacitor Cc should ideally be equal to the value of Vb, or Vcm2−Vcm1. In practice, however, parasitic capacitances may prevent this from being the case. In this embodiment, the parasitic capacitance may be a sum of a plate parasitic capacitance of Cc and an input capacitance of the next stage. This can in turn result in signal attenuation across capacitor Cc while also leaving a residue of the input signal, Vin, on Cc. This residue may be defined by a ratio of the parasitic capacitance to the capacitance of capacitor Cc. This in turn can cause a loss of a fraction of the signal across capacitor Cc. As a result, sub-sampling and aliasing of the input signal may occur, and this can result in a significant reduction in signal-to-noise ratio between Vin and Vout.

The solution to the problem described in the previous paragraph is provided by shield 25 and its electrical coupling to the source terminal of M1. Transistor M1 is arranged in a source follower buffer configuration, and thus the potential on the shield tracks the signal on Vout. Additionally, the implementation of shield 25 around capacitor Cc and driving it in accordance with the output signal on Vout, provides immunity to external noise affecting Cc.

Figure 3:
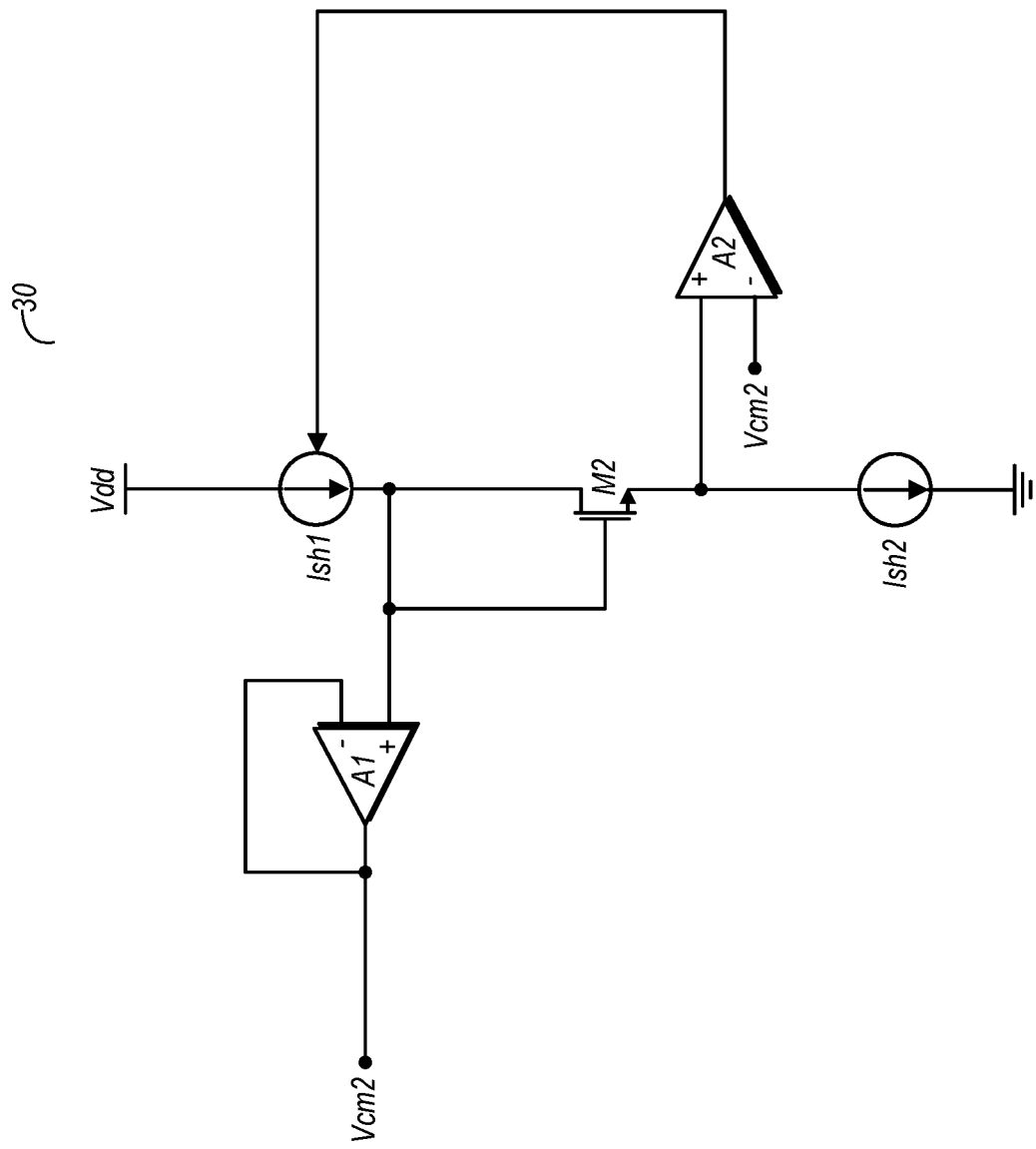
FIG. 3 is a schematic diagram illustrating one embodiment of a bias circuit.

FIG. 3 is a schematic diagram illustrating one embodiment of a bias circuit. In the embodiment shown, bias circuit 30 is used to generate the second common mode voltage, Vcm2. As shown here, bias circuit 30 includes a first amplifier A1 having an output coupled to provide the second common mode voltage, wherein the amplifier includes an inverting input coupled to its own output and further includes a non-inverting input. First and second current sources, Ish1 and Ish2 respectively, are also included in this embodiment, with the output of Ish1 being coupled to the non-inverting input of A1. Transistors M2 includes gate and drain terminals coupled to the non-inverting input of amplifier A1, with its drain terminal is further coupled to a first current source Ish1. The second current source Ish2 coupled to the source terminal of M2. Transistor M2 in the embodiment shown is a replica of M1 (of FIG. 2), and is also arranged in a source follower configuration. Bias circuit 30 also includes a second amplifier, A2 having an inverting input coupled to the source terminal of M2, a non-inverting input coupled to receive the second common mode voltage, Vcm2, and an output coupled to the first current source, Ish1.

Bias circuit 30 may be coupled to coupling network 20, and may adaptively adjust the second common mode voltage responsive to process, voltage, and temperature variations. In the embodiment of coupling network 20 shown in FIG. 2, the source follower buffer stage (implemented by M1) may require a process, voltage, and temperature independent common mode voltage in order to maximize the signal swing. This in turn may require adaptive allocation of the voltage level-shifter value Vb. Accordingly, bias circuit 30 as shown here in FIG. 3 generates the common mode voltage Vcm2, resulting in a fixed and independent common mode at the output of the source follower buffer stage.

In the embodiment shown, the current through M2 and Ish2 is a scaled copy of the current through M1 and current source I1 from FIG. 2. The desired common mode voltage level of functional circuit block 15 (of FIG. 1), which receives the signal from the coupling network, is thus set by the value of Vcm2. Negative feedback formed by amplifier A2, current source Ish1, and transistor M2 may operate to dynamically adjust the value of Vcm2 in order to obtain a common mode voltage that is process, voltage, and temperature independent. The error between a desired common mode voltage Vcm2 and the actual common mode is set by a loop gain of the negative feedback circuit. The voltage shift across capacitor Cc, as shown in FIGS. 1 and 2, is dynamically controlled by replica feedback in order to obtain a fixed, robust common mode voltage at the Vout node in the source follower circuit of FIG. 2.

Figure 4:
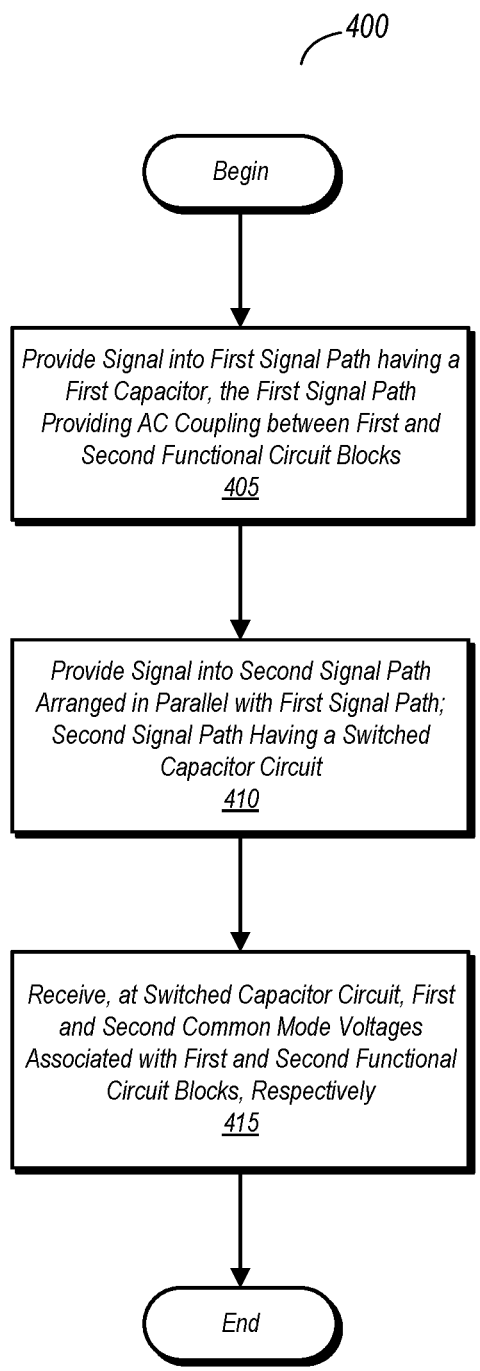
FIG. 4 is a flow diagram of one embodiment of a method for conveying signals between functional circuit blocks through a coupling network.

FIG. 4 is a flow diagram of one embodiment of a method for conveying signals between functional circuit blocks through a coupling network. Method 400 as shown here may be performed by various embodiments of the circuits discussed above and shown in FIGS. 1-3. It is further noted that other circuit embodiments may be capable of carrying out method 400, and may thus fall within the scope of this disclosure.

Method 400 is a method for conveying a signal from a first functional circuit block to a second functional circuit block through a coupling network, and includes providing the signal to a first signal path having a first capacitor, the first signal path providing AC coupling between the first and second functional circuit blocks (block 405). The method further includes providing the signal into a second signal path arranged in parallel with the first signal path, the second signal path including a switched capacitor circuit (block 410). With respect to the switched capacitor circuit, the method includes receiving, at the switched capacitor circuit, first and second common mode voltages corresponding to the first and second functional circuit blocks, respectively (block 415).

In various embodiments, the method may also include a transistor of the coupling network providing an output signal on a source terminal thereof, the transistor having a gate terminal coupled to a junction of the first and second signal paths. Shielding the first capacitor from externally generated electromagnetic noise may be performed by a shield surrounding the first capacitor, with the shield being electrically coupled to the source terminal of the transistor. In some embodiments, the method includes a bias circuit adaptively adjusting the second common mode voltage responsive to process, voltage, and temperature variations.

In various embodiments having switched capacitor circuitry (such as that shown in FIG. 2), the switched capacitor includes second and third capacitors (e.g., CR1 and CR2 of FIG. 2, with Cc being the first capacitor). A method embodiment performed with such a circuit includes coupling, responsive to an active phase of a first clock signal, the second capacitor in parallel with the first capacitor, and coupling, responsive to an inactive phase of a second clock signal, the third capacitor between the first and second common mode voltages. The method in this embodiment also includes coupling, responsive to an active phase of the second clock signal, the third capacitor in parallel with the first capacitor, and coupling, responsive to an inactive phase of the first clock signal, the second capacitor between the first and second common mode voltages. The first and second clock signals in this embodiment are opposite in phase with respect to one another.

Figure 5:
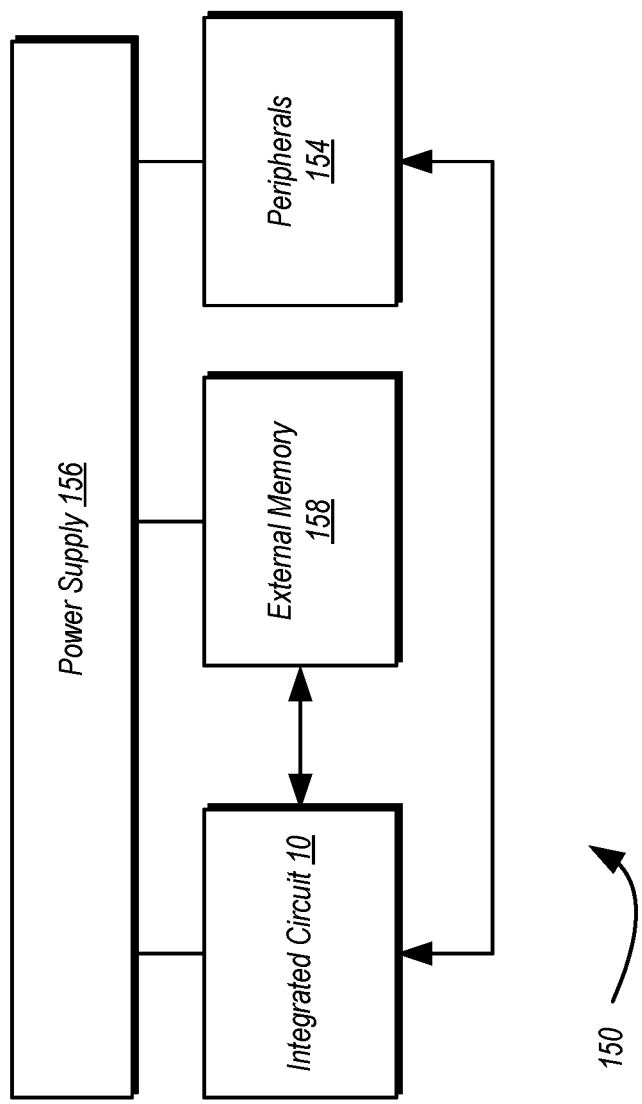
FIG. 5 is a block diagram of one embodiment of an example system.

Turning next to FIG. 5, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

In various embodiments of system 150, IC and/or various functional circuit blocks in peripherals 154 may include functional circuit blocks that are coupled to one another by instances of a coupling network 20 in accordance with this disclosure.

Numerous variations and modifications will become apparent to those skilled in the art once the above disclosure is fully appreciated. It is intended that the following claims be interpreted to embrace all such variations and modifications.

What is claimed is:

1. A circuit comprising:
a coupling network coupled between first and second functional blocks and configured to convey signals from the first functional circuit block to the second functional circuit block, wherein the coupling network includes:
a first signal path having a first capacitor, wherein the first signal path is configured to provide AC coupling between the first and second functional circuit blocks;
a second signal path in parallel with the first signal path, the second signal path including a switched capacitor circuit, wherein the switched capacitor circuit is coupled to receive a first common mode voltage corresponding to the first functional circuit block and a second common mode voltage corresponding to the second functional circuit block; and
a transistor having a gate terminal coupled to a junction of the first and second signals paths and a source terminal coupled to provide an output signal from the coupling network to the second functional circuit block.

2. The circuit as recited in claim 1, further comprising an electrical shield surrounding the first capacitor, wherein the electrical shield is electrically coupled to the source terminal of the transistor.

3. The circuit as recited in claim 1, wherein the switched capacitor circuit includes a second capacitor and a third capacitor, a first plurality of switches, and a second plurality of switches, wherein the first plurality of switches are configured to close responsive to an active phase of a first clock signal and wherein the second plurality of switches are configured to close responsive to an active phase of a second clock signal.

4. The circuit as recited in claim 3, wherein, responsive to closing of each of the first plurality of switches, the second capacitor is coupled between the first and second common mode voltages and the third capacitor is coupled in parallel with the first capacitor.

5. The circuit as recited in claim 3, wherein responsive to closing of each of the second plurality of switches, the second capacitor is coupled in parallel with the first capacitor and the third capacitor is coupled between the first and second common mode voltages.

6. The circuit as recited in claim 3, further comprising a clock circuit configured to generate the first and second clock signals, wherein the first and second clock signals are opposite in phase with respect to one another.

7. The circuit as recited in claim 1, further comprising a bias circuit configured to generate the second common mode voltage.

8. The circuit as recited in claim 7, wherein the bias circuit includes:
   a first amplifier having an output coupled to provide the second common mode voltage, wherein the amplifier includes an inverting input coupled to the output of the first amplifier and further includes a non-inverting input;
   a transistor having gate and drain terminals coupled to the non-inverting input of the first amplifier, wherein the drain terminal is further coupled to a first current source;
   a second current source coupled to a source terminal of the transistor; and
   a second amplifier having an inverting input coupled to the source terminal of the transistor, a non-inverting input coupled to receive the second common mode voltage, and an output coupled to the first current source.

9. The circuit as recited in claim 7, wherein the bias circuit is configured to adaptively adjust the second common mode voltage responsive to process, voltage, and temperature variations.

10. A method comprising:
   conveying a signal from a first functional circuit block to a second functional circuit block through a coupling network, wherein conveying the signal through the coupling network includes:
      providing the signal to a first signal path having a first capacitor, the first signal path providing AC coupling between the first and second functional circuit blocks;
      providing the signal into a second signal path arranged in parallel with the first signal path, the second signal path including a switched capacitor circuit;
      receiving, at the switched capacitor circuit, first and second common mode voltages corresponding to the first and second functional circuit blocks, respectively; and
      a transistor of the coupling network providing an output signal on a source terminal thereof, the transistor having a gate terminal coupled to a junction of the first and second signal paths.

11. The method as recited in claim 10, further comprising shielding the first capacitor from externally generated electromagnetic noise, wherein shielding is performed by a shield surrounding the first capacitor, the shield being electrically coupled to the source terminal of the transistor.

12. The method as recited in claim 10, further comprising a bias circuit adaptively adjusting the second common mode voltage responsive to process, voltage, and temperature variations.

13. The method as recited in claim 10, wherein the switched capacitor circuit includes second and third capacitors, and wherein the method further comprises:
   coupling, responsive to an active phase of a first clock signal, the second capacitor in parallel with the first capacitor;
   coupling, responsive to an inactive phase of a second clock signal, the third capacitor between the first and second common mode voltages;
   coupling, responsive to an active phase of the second clock signal, the third capacitor in parallel with the first capacitor; and
   coupling, responsive to an inactive phase of the first clock signal, the second capacitor between the first and second common mode voltages;
   wherein the first and second clock signals are opposite in phase with respect to one another.

14. A system comprising:
   a first functional circuit block;
   a second functional circuit block; and
   a coupling network coupled between the first and second functional blocks and configured to convey signals from the first functional circuit block to the second functional circuit block, wherein the coupling network includes:
      a first signal path having a first capacitor, wherein the first signal path is configured to provide AC coupling between the first and second functional circuit blocks;
      a second signal path in parallel with the first signal path, the second signal path including a resistor and a switched capacitor circuit, wherein the switched capacitor circuit is coupled to receive a first common mode voltage corresponding to the first functional circuit block and a second common mode voltage corresponding to the second functional circuit block;
      a transistor having a gate terminal coupled to a junction of the first and second signals paths and a source terminal coupled to provide an output signal from the coupling network to the second functional circuit block; and
      a bias circuit configured to generate the second common mode voltage.

15. The system as recited in claim 14, further comprising an electrical shield surrounding the first capacitor, wherein the electrical shield is electrically coupled to the source terminal of the transistor.

16. The system as recited in claim 14, wherein the bias circuit is configured to adaptively adjust the second common mode voltage responsive to process, voltage, and temperature variations, and wherein the bias circuit includes:
   a first amplifier having an output coupled to provide the second common mode voltage, wherein the amplifier includes an inverting input coupled to the output of the first amplifier and further includes a non-inverting input;
   a transistor having gate and drain terminals coupled to the non-inverting input of the transistor, wherein the drain terminal is further coupled to a first current source;
   a second current source coupled to a source terminal of the transistor; and
   a second amplifier having an inverting input coupled to the source terminal of the transistor, a non-inverting input coupled to receive the second common mode voltage, and an output coupled to the first current source.

17. The system as recited in claim 14, wherein the switched capacitor circuit includes a second capacitor and a third capacitor, a first plurality of switches, and a second plurality of switches, wherein the first plurality of switches are configured to close responsive to an active phase of a first clock signal and wherein the second plurality of switches are configured to close responsive to an active phase of a second clock signal.

18. The system as recited in claim 17, further comprising a clock generation circuit configured to generate the first and second clock signals.

19. The circuit of claim 1, wherein the second signal path includes a first sub-path and a second sub-path each having respective switched capacitor, wherein a switched capacitor in the first sub-path is charged and discharged on opposite and non-overlapping clock phases with respect to charging and discharging of a switched capacitor in the second sub-path.

20. The method of claim 10, wherein providing the signal into the second signal path comprises providing the signal into first and second sub-paths such that a switched capacitor in the first sub-path is charged and discharged on opposite and non-overlapping clock phases with respect to charging and discharging of a switched capacitor in the second sub-path.

* * * * *